(12) United States Patent
Lee

(10) Patent No.: US 9,423,419 B2
(45) Date of Patent: Aug. 23, 2016

(54) TEST SOCKET INCLUDING ELECTRODE SUPPORTING PORTION AND METHOD OF MANUFACTURING TEST SOCKET

(71) Applicant: ISC CO., LTD., Gyeonggi-do (KR)

(72) Inventor: Jae Hak Lee, Gyeonggi-do (KR)

(73) Assignee: ISC, Co. Ltd., Gyeonggi-do (KR)

( * ) Notice: Subject to any disclaimer, the term of this patent is extended or adjusted under 35 U.S.C. 154(b) by 456 days.

(21) Appl. No.: 13/872,493

(22) Filed: Apr. 29, 2013

(65) Prior Publication Data

US 2013/0285692 A1   Oct. 31, 2013

(51) Int. Cl.
*G01R 31/00* (2006.01)
*G01R 1/04* (2006.01)
*G01R 3/00* (2006.01)

(52) U.S. Cl.
CPC .......... *G01R 1/0408* (2013.01); *G01R 1/0466* (2013.01); *G01R 3/00* (2013.01); *Y10T 29/49208* (2015.01)

(58) Field of Classification Search
CPC .............. G01R 31/28; G01R 31/2887; G01R 31/2896; G01R 31/2886; G01R 31/0408; G01R 31/0483; G01R 31/0466; G01R 31/0433; G01R 31/2893; G01R 31/2851; G01R 1/07342; G01R 1/06711; G01R 1/06738; G01R 1/06772; G01R 31/31924; G01R 31/3004; G01R 31/2884; G01R 31/31922
USPC ............ 324/756.01–756.03, 755.22, 754.01, 324/754.03, 754.07–754.14, 757.03, 324/755.01, 755.11, 762.01–762.05, 324/757.01–757.05
See application file for complete search history.

(56) References Cited

U.S. PATENT DOCUMENTS

| | | | |
|---|---|---|---|
| 6,574,114 B1 * | 6/2003 | Brindle .............. | G02B 6/12007 174/262 |
| 7,384,279 B2 * | 6/2008 | Igarashi ............... | G01R 1/0735 439/66 |

(Continued)

FOREIGN PATENT DOCUMENTS

| KR | 1020070027697 A | 3/2007 |
|---|---|---|
| KR | 1020100005535 A | 1/2008 |

(Continued)

OTHER PUBLICATIONS

Notice of Allowance dated Oct. 30, 2012 of Korean Patent Application No. 10-2012-0044684, 2 pages [translation].

*Primary Examiner* — Tung X Nguyen
*Assistant Examiner* — Thang Le
(74) *Attorney, Agent, or Firm* — Schwabe, Williamson & Wyatt P.C.

(57) ABSTRACT

The test socket includes: an elastic conductive sheet including a conductive portion and an insulating supporting portion; a sheet type connector including an electrode portion that is disposed on the conductive portion and is formed of a metal, and a sheet member that supports the electrode portion, wherein the sheet member comprises a cut portion formed by cutting at least a portion of the sheet member between adjacent electrode portions; and an electrode supporting portion including an upper supporting portion that contacts an upper edge of the electrode portion to support the electrode portion and exposes an upper center portion of the electrode portion to be open and an electrode supporting portion including a connection supporting portion that connects the upper supporting portion and the insulating supporting portion.

3 Claims, 13 Drawing Sheets

(56) References Cited

U.S. PATENT DOCUMENTS

| | | | | |
|---|---|---|---|---|
| 7,656,176 B2 * | 2/2010 | Yoshioka | ............ | G01R 1/0735 324/756.07 |
| 7,726,984 B2 * | 6/2010 | Bumb, Jr. | ............ | H01R 13/2414 439/591 |
| 8,704,377 B2 * | 4/2014 | Rathburn | ............ | H05K 3/4069 174/254 |
| 2001/0016435 A1 * | 8/2001 | Fujimura | ............ | G01R 1/0483 439/66 |
| 2004/0205402 A1 * | 10/2004 | Yamaguchi | ........ | G01R 31/2886 714/30 |
| 2006/0160383 A1 * | 7/2006 | Yamada | ............ | G01R 1/06755 439/86 |
| 2007/0269999 A1 * | 11/2007 | Di Stefano | .......... | G01R 1/0466 439/73 |
| 2008/0113524 A1 * | 5/2008 | Ha | ....................... | G01R 1/0466 439/39 |
| 2008/0311769 A1 * | 12/2008 | Yamada | ............... | G01R 1/0466 439/68 |
| 2008/0315900 A1 * | 12/2008 | Ysaguirre | ............ | G01R 1/0433 324/756.02 |

FOREIGN PATENT DOCUMENTS

| | | |
|---|---|---|
| KR | 1020080059260 A | 6/2008 |
| KR | 100926777 B1 | 6/2009 |
| KR | 20-0445395 | 7/2009 |

\* cited by examiner

TEST SOCKET INCLUDING ELECTRODE SUPPORTING PORTION AND METHOD OF MANUFACTURING TEST SOCKET

CROSS-REFERENCE TO RELATED PATENT APPLICATION

This application claims the benefit of Korean Patent Application No. 10-2012-0044684, filed on Apr. 27, 2012, in the Korean Intellectual Property Office, the disclosure of which is incorporated herein in its entirety by reference.

BACKGROUND OF THE INVENTION

1. Field of the Invention

The present invention relates to a test socket including an electrode supporting portion and a method of manufacturing the test socket, and more particularly, to a test socket including an electrode supporting portion that firmly supports an electrode portion and also allows independent movement of a plurality of electrodes, and a method of manufacturing the test socket.

2. Description of the Related Art

In general, to test electrical characteristics of a subject device, the subject device and an inspection device have to be stably electrically connected. As a unit for connecting a subject device and an inspection device, a test socket is typically used.

The function of the test socket is to connect a terminal of a subject device and a pad of an inspection device so as to allow two-way exchange of an electrical signal. To this end, as a contacting unit used inside the test socket, an elastic conductive sheet or a pogo pin is used. An elastic conductive sheet is used to bring an elastic conductive portion into contact with a terminal of a subject device, and a pogo pin includes a spring so as to make connection between a subject device and an inspection device easy and buffer mechanical impact that may occur in the connection, and thus an elastic conductive sheet or a pogo pin is used in most test sockets.

However, due to frequent contacts with respect to a terminal of a subject device that requires electrical connection, an upper portion of a conductive portion of the elastic conductive sheet may be easily damaged. That is, the conductive portion, in which a plurality of conductive particles are arranged in a soft silicon rubber, is frequently in contact with the terminal of the subject device, which is formed of a metal, and thus, the silicon rubber may be easily damaged. Consequently, the conductive particles arranged in the conductive portion may detach from the conductive portion to thereby degrade the entire conductivity of the elastic conductive sheet.

In order to solve this problem, KR 2008-59260 discloses a technique of arranging an insulating sheet on an elastic conductive sheet. Here, an electrode is formed at a portion in the insulating sheet corresponding to a conductive portion of the elastic conductive sheet, and a terminal of a subject device contacts this electrode, so as to minimize damage of the conductive portion. However, a test socket according to the conventional art has the following drawbacks.

First, electrodes that are confined in the insulating sheet are not able to freely move in a vertical direction. That is, each of the electrodes is connected to the insulating sheet, and thus positions of adjacent electrodes are interfered so that each electrode may not move independently. If movement of the electrodes is restricted as described above, and if heights of terminals of a subject device vary to some extent, the difference in the heights of the terminals may not be balanced so that the terminals and the electrodes may not contact each other properly.

In addition, since each electrode is fixed only on the insulating sheet, there is also a probability that the electrodes may detach from the insulating sheet when they are brought into contact with the terminals of the subject device.

SUMMARY OF THE INVENTION

The present invention provides a test socket including an electrode supporting portion that not only allows a high degree of freedom of an electrode portion as much as possible and independent movement of the electrode portion but also minimizes detachment of the electrode portion from a sheet member, and a method of manufacturing the test socket.

According to an aspect of the present invention, there is provided a test socket including an electrode supporting portion, which is disposed between a terminal of a subject device and a pad of an inspection device to electrically connect the terminal and the pad, the test socket comprising: an elastic conductive sheet including a conductive portion, in which a plurality of conductive particles are arranged in an insulating material so that conductivity is exhibited in a thickness direction, at each position of a subject device corresponding to a terminal, and an insulating supporting portion that supports and insulates the conductive portion at a same time; a sheet type connector including an electrode portion that is disposed on the conductive portion and is formed of a metal, and a sheet member that supports the electrode portion, wherein the sheet member comprises a cut portion formed by cutting at least a portion of the sheet member between adjacent electrode portions; and an electrode supporting portion including an upper supporting portion that contacts an upper edge of the electrode portion to support the electrode portion and exposes an upper center portion of the electrode portion to be open and an electrode supporting portion including a connection supporting portion that connects the upper supporting portion and the insulating supporting portion.

The cut portion may be a cutting opening formed around an entire circumference of the electrode portion.

The cut portion may be formed in a portion of a space between adjacent electrode portions and may be a cut through-hole passing through upper and lower surfaces of the sheet member.

A portion of the electrode supporting portion corresponding to the cut through hole may be in a form of a concave recess so as to pass through the cut through-hole.

The cut through-hole may have a circular or polygonal cross-section.

The sheet member may be a film formed of a synthetic resin material.

The sheet member may be a porous sheet in which plurality of openings are formed.

The electrode portion may fill the openings of the sheet member and may be protruded from upper and lower surfaces of the sheet member to be integrally coupled to the sheet member.

According to another aspect of the present invention, there is provided a method of manufacturing a test socket including an electrode supporting portion, which is disposed between a terminal of a subject device and a pad of an inspection device to electrically connect the terminal and the pad, the method comprising: forming an elastic conductive sheet including a conductive portion, in which a plurality of conductive particles are arranged in an insulating material so that conductivity is exhibited in a thickness direction, at each position of a subject device corresponding to a terminal, and an insulating supporting portion that supports and insulates the conductive portion at a same time; forming a sheet type connector formed of a sheet member to which an electrode portion is coupled at each corresponding position to the conductive portion, and attaching the sheet type connector to the elastic conductive sheet; forming a cut portion by cutting at least a portion of the sheet member between adjacent electrode portions; coating an insulating material on the sheet type connector to cover the sheet type connector; and forming an electrode supporting portion by removing insulating material disposed on a portion corresponding to a center portion of the electrode portion so that the center portion of the electrode portion is exposed.

The method may further include removing insulating material disposed on a portion of the electrode supporting portion corresponding to the cut portion.

According to another aspect of the present invention, there is provided a method of manufacturing a test socket including an electrode supporting portion, which is disposed between a terminal of a subject device and a pad of an inspection device to electrically connect the terminal and the pad, the method comprising: forming an elastic conductive sheet including a conductive portion, in which a plurality of conductive particles are arranged in an insulating material so that conductivity is exhibited in a thickness direction, at each position of a subject device corresponding to a terminal, and an insulating supporting portion that supports and insulates the conductive portion at a same time; forming a sheet type connector formed of a sheet member to which an electrode portion is coupled at each corresponding position to the conductive portion, and forming a cut portion by cutting at least a portion of the sheet member between adjacent electrode portions; attaching the sheet type connector on the elastic conductive sheet; coating an insulating material on the sheet type connector to cover the sheet type connector; and forming an electrode supporting portion by removing the insulating material disposed on a portion corresponding to a center portion of the electrode portion so that the center portion of the electrode portion is exposed.

According to another aspect of the present invention, there is provided a method of manufacturing a test socket including an electrode supporting portion, which is disposed between a terminal of a subject device and a pad of an inspection device to electrically connect the terminal and the pad, the method comprising: forming an elastic conductive sheet including a conductive portion, in which a plurality of conductive particles are arranged in an insulating material so that conductivity is exhibited in a thickness direction, at each position of a subject device corresponding to a terminal, and an insulating supporting portion that supports and insulates the conductive portion; forming a sheet type connector formed of a porous sheet to which an electrode portion is formed at each corresponding position to the conductive portion; coating an insulating material on the sheet type connector to cover the sheet type connector; and forming a cut portion by cutting at least a portion of the porous sheet between adjacent electrode portions.

The cut portion may be formed by using a laser.

According to another aspect of the present invention, there is provided a test socket including an electrode supporting portion, which is disposed between a terminal of a subject device and a pad of an inspection device to electrically connect the terminal and the pad, the test socket comprising: an elastic conductive sheet including a conductive portion, in which a plurality of conductive particles are arranged in an insulating material so that conductivity is exhibited in a thickness direction, at each position of a subject device corresponding to a terminal, and an insulating supporting portion that supports and insulates the conductive portion; a sheet type connector including an electrode portion that is disposed on or under the conductive portion and is formed of a metal, and a sheet member that supports the electrode portion, wherein the sheet member comprises a cut portion formed by cutting at least a portion of the sheet member between adjacent electrode portions; and an electrode supporting portion including an upper supporting portion that contacts an edge of a surface of the electrode portion to support the electrode portion.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, a test socket 100 according to an embodiment of the present invention will be described in detail with reference to attached drawings.

The test socket according to the current embodiment of the present invention is disposed between a terminal of a subject device and a pad of an inspection device so as to electrically connect the terminal and the pad.

Figure 1:
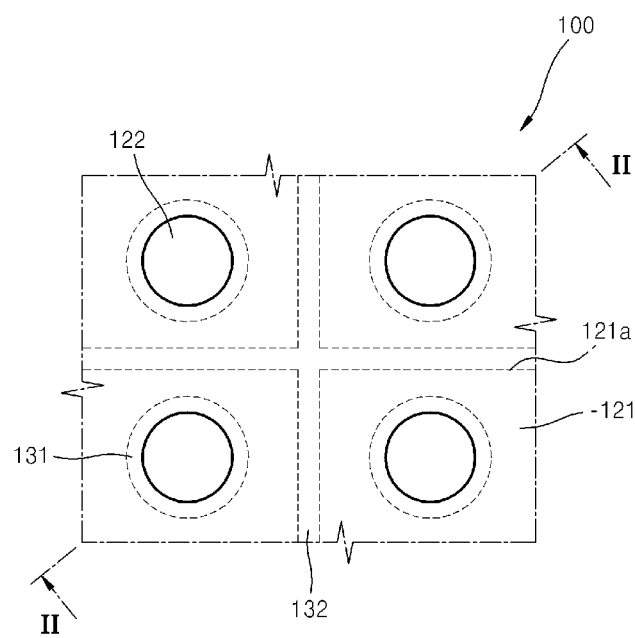
FIG. 1 is a plan view of a test socket according to an embodiment of the present invention.
Figure 2:
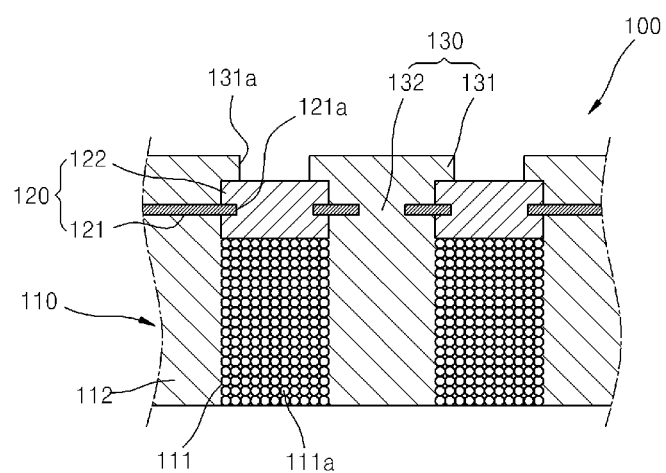
FIG. 2 is a cross-sectional view of the test socket of FIG. 1 cut along a line II-II according to an embodiment of the present invention.
Figure 3:
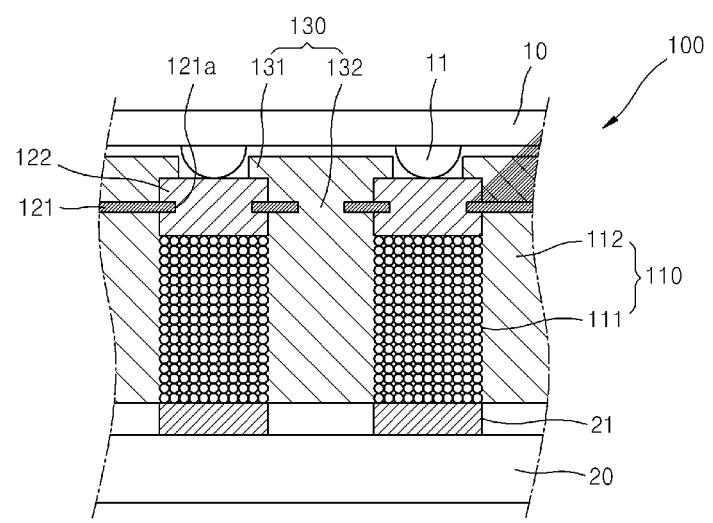
FIG. 3 is an operation diagram of a test socket according to an embodiment of the present invention.

Referring to FIGS. 1 through 3, the test socket 100 is formed of an elastic conductive sheet 110, a sheet type connector 120, and an electrode supporting portion 130.

The elastic conductive sheet 110 allows an electrical flow in a thickness direction but blocks an electrical flow in a surface direction, which is orthogonal to the thickness direction; the elastic conductive sheet 110 is formed to have an overall elasticity. The elastic conductive sheet 110 includes a conductive portion 111 and an insulating supporting portion 112.

The conductive portion 111 is disposed at each position corresponding to a terminal 11 of a subject device 10, capable of exhibiting conductivity in a thickness direction, and formed of an elastic insulating material in which a plurality of conductive particles 111a are arranged.

As the insulating material, a heat-resistant polymer material having a cross-linking structure may preferably be used. As a material for forming a curable polymer material, which may be used to obtain the cross-linking polymer material, a liquid silicon rubber is preferable from among various materials. While either an additive type or a condensation type liquid silicon rubber may be used, an additive type liquid silicon rubber is preferable. When forming the conductive portion 111 by using a cured product of a liquid silicon rubber (hereinafter referred to as a "silicon rubber cured product"), the silicon rubber cured product may have, at 150° C., a compression set of 10% or smaller, preferably, 8% or smaller, or more preferably, 6% or smaller. When the compression set exceeds 10%, and when the elastic conductive sheet 110 that may be obtained is repeatedly used under a high temperature environment, a chain of the conductive particles 111a in the conductive portion 111 may be disordered, and accordingly, it is difficult to maintain a required conductivity of the elastic conductive sheet 110.

As the conductive particles 111a, core particles that have magnetic properties (hereinafter, "magnetic core particles") and are coated with a high conductivity metal may be preferably used. The magnetic core particles from which the conductive particles 111a are to be formed may preferably have a number average particle diameter of about 3 μm to 40 μm. Here, the number average particle diameter of the magnetic core particles refers to that which is measured by using a laser diffraction diffusion method. Examples of a material for forming the magnetic core particles include iron, nickel, cobalt, or materials formed of copper or a resin coated with these metals. In detail, materials having a saturation magnetization of 0.1 $Wb/m^2$ or greater may be used, materials having a saturation magnetization of 0.3 $Wb/m^2$ or greater may preferably be used, or materials having a saturation magnetization of 0.5 $Wb/m^2$ or greater may be used. In detail, examples of the materials for forming the magnetic core particles include iron, nickel, cobalt, and an alloy thereof.

Examples of the high conductivity metal coated on surfaces of the magnetic core particles include gold, silver, rhodium, platinum, and chromium, and from among these, gold, which is chemically stable and also has a high conductivity, may preferably be used.

The insulating supporting portion 112 supports and insulates each conductive portion 111 at the same time, and may be formed of a material having elasticity and excellent insulating properties. In detail, the same material as the insulating material of the conductive portion 111 may be used.

The sheet type connector 120 is formed of an electrode portion 122 that is disposed on the conductive portion 111 and is formed of a metal and a sheet member 121 that supports the electrode portion 122.

The electrode portion 122 is formed of a metal having excellent conductivity, and may approximately have an I shape, but is not limited thereto. Examples of a material for forming the electrode portion 122 may include copper, nickel, cobalt, gold, aluminum, and an alloy of these. The electrode portion 122, in a number corresponding to the number of the terminal 11 of the subject device 10, is attached to the sheet member 121, and a plurality of electrode portions 122 are spaced apart from one another.

A plurality of insertion holes are formed in the sheet member 121 at positions corresponding to the terminals 11 of the subject device 10 such that the electrode portions 122 are respectively inserted into the insertion holes; the electrode portions 122 are inserted into the insertion holes to be fixed. Examples of materials for forming the sheet member 121 include synthetic resin materials such as resin materials, for example, a liquid crystal polymer, a polyimide resin, a polyester resin, or a polyaramide resin; fiber reinforcement type resin materials such as a glass fiber reinforcement type epoxy resin, a glass fiber reinforcement type polyester resin, or a glass fiber reinforcement type polyimide resin; or a film formed of a composite resin material formed of an epoxy resin including an inorganic material such as alumina or a boron nitride as a filler.

A cutting opening that is cut in a form to surround the overall circumference of the electrode portion 122 is formed in the sheet member 121. Accordingly, the sheet member 121 disposed around the electrode portion 122 is separated by a predetermined distance from other sheet members 121 that are attached to other adjacent electrode portions 122.

The sheet type connector 120 is attached on an upper surface of the elastic conductive sheet 110; in detail, the sheet type connector 120 is formed such that an upper end of the conductive portion 111 of the elastic conductive sheet 110 and a lower end of the electrode portion 122 may contact each other. Accordingly, a current flowing through the conductive portion 111 may be transmitted to the terminal 11 of the subject device 10 through the electrode portion 122.

The electrode supporting portion 130 may support the electrode portion 122 of the sheet type connector 120; in detail, the electrode supporting portion 130 is formed of an upper supporting portion 131 and a connection supporting portion 132.

The upper supporting portion 131 contacts an upper edge of the electrode portion 122 to support the electrode portion 122 and keeps an upper center portion of the electrode portions 122 open. The upper supporting portion 131 has a central hole 131a having an approximate circular shape, and surrounds the electrode portion 122.

The connection supporting portion 132 integrally connects the upper supporting portion 131 and the insulating supporting portion 112. As described above, as the upper supporting portion 131 is connected to the insulating supporting portion 112 via the connection supporting portion 132, the upper supporting portion 131 may firmly support the electrode portion 122. The electrode supporting portion 130 may be formed of the same material as the insulating supporting portion 112, but is not limited thereto, and may be formed of any material that has good elasticity and insulating properties. Also, the upper supporting portion 131 may be formed of any conductive material under a condition in which an electrical connection between the upper supporting portion 131 and adjacent conductive portions 111 is prevented.

The test socket 100 according to the current embodiment of the present invention may be manufactured as follows.

FIGS. 4A through 4F illustrate a method of manufacturing the test socket 100 of FIG. 1 according to an embodiment of the present invention.

Figure 4A:
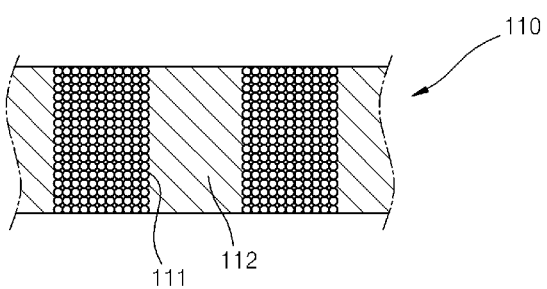
FIGS. 4A through 4F illustrate a method of manufacturing the test socket of FIG. 1 according to an embodiment of the present invention.

First, as illustrated in FIG. 4A, an elastic conductive sheet 110 including a conductive portion 111, in which a plurality of conductive particles 111a are arranged in an insulating material so that conductivity may be exhibited in a thickness direction, at each position of a subject device 10 corresponding to a terminal 11, and an insulating supporting portion 112 that supports and insulates the conductive portion 111 at the same time, is provided. A method of manufacturing the elastic conductive sheet 110 is well-known in the art, and thus detailed description thereof will be omitted.

Figure 4B:
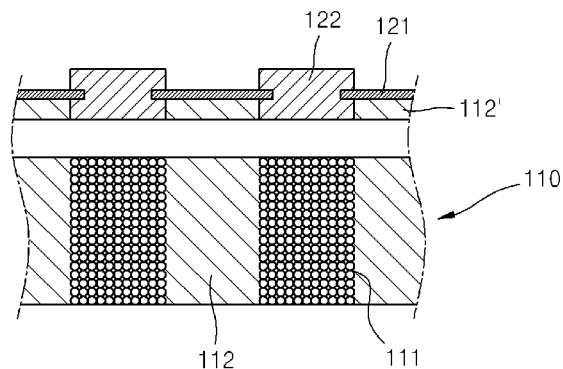

Then, as illustrated in FIG. 4B, a sheet type connector 120 including a sheet member 121 and an electrode portion 122 that is coupled to the sheet member 121 at each position corresponding to the conductive portion 111 is provided. A method of manufacturing the sheet type connector 120 is also well-known in the art, and thus detailed description thereof will be omitted.

Figure 4C:
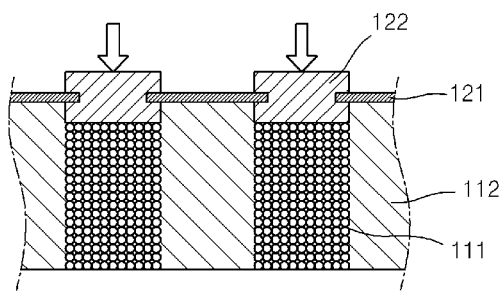

Then, as illustrated in FIG. 4C, the sheet type connector 120 is attached on the elastic conductive sheet 110. Here, the electrode portion 122 of the sheet type connector 120 is formed to be in contact with an upper surface of the conductive portion 111 of the elastic conductive sheet 110. In addition, an adhesive to attach the sheet member 121 to the elastic conductive sheet 110 may be coated on a lower surface of the sheet member 121 of the sheet type connector 120 so that the sheet type connector 120 is easily attached on the elastic conductive sheet 110.

Figure 4D:
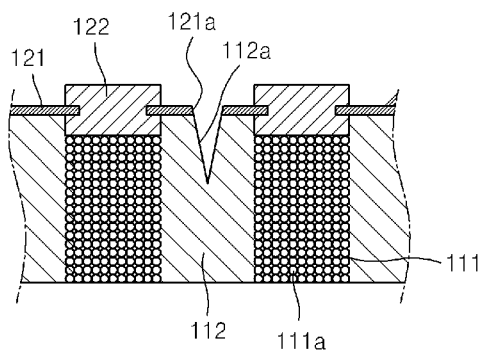

Thereafter, as illustrated in FIG. 4D, at least a portion of the sheet member 121 between the electrode portions 122 is cut to form a cut portion 121a. In detail, the sheet member 121 is cut in a form to surround the electrode portions 122 while including a predetermined distance between the sheet member 121 and each of the electrode portions 122. The cut portion 121a may be formed by using a laser. When laser is used, intensity of light is adjusted such that a lower surface of the elastic conductive sheet 110 is not cut.

Figure 4E:
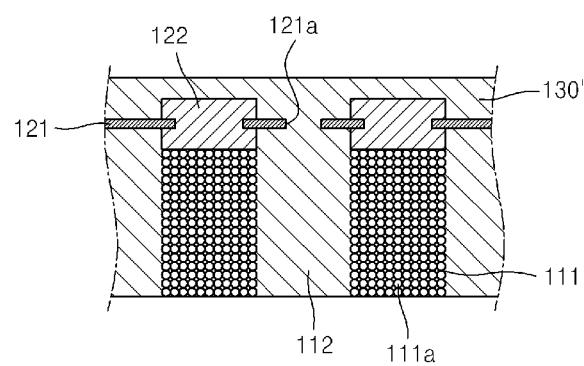

Then, as illustrated in FIG. 4E, an insulating material is applied on the sheet type connector 120 to cover the same. That is, an insulating material 130' is applied to sufficiently cover the sheet member 121 and the electrode portions 122 of the sheet type connector 120. The insulating material 130' used here may be the same material as that of the insulating supporting portion 112 of the elastic conductive sheet 110.

Figure 4F:
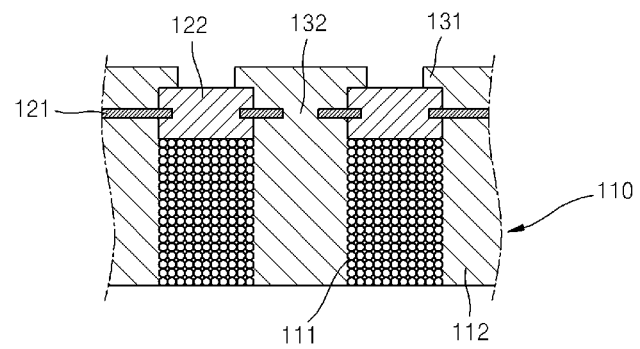

Then, as illustrated in FIG. 4F, laser is irradiated to a position corresponding to a center portion of the electrode portion 122 such that the center portion of the electrode portion 122 may be exposed to the outside, thereby removing the insulating material disposed on the electrode portion 122 and forming the electrode supporting portion 130. Here, the laser may be irradiated to the insulating material by adjusting intensity of light to the extent of removing only the insulating material without affecting the electrode portion 122.

The test socket 100 manufactured in this manner may operate as follows.

As illustrated in FIG. 3, after mounting the test socket 100 in the inspection device 20, the subject device 10 is fixed in the test socket 100. The test socket 100 allows a lower surface of the conductive portion 111 to contact a pad 21 of the inspection device 20, and the terminal 11 of the subject device 10 to contact the electrode portion 122 of the sheet type connector 120. In detail, the terminal 11 of the subject device 10 contacts a center of the electrode portion 122, which is surrounded by the electrode supporting portion 130.

Thereafter, when a predetermined inspection signal is applied from the inspection device 20, the inspection signal passes through the conductive portion 111 of the elastic conductive sheet 110 to be transferred to the terminal 11 of the subject device 10 so as to conduct a predetermined electrical test.

According to the test socket 100 of the current embodiment of the present invention, the sheet member 121, which supports each electrode portion 122, is cut via the cut portion 121a, and thus, each electrode portion 122 coupled to the sheet member 121 may sufficiently move in a vertical direction without being affected by other adjacent electrode portions 122. That is, each electrode portion 122 may have a sufficient displacement range so that the electrode portion 122 and a terminal 11 of a subject device may contact each other firmly even when heights of electrodes 122 of the subject device 10 are not uniform.

In addition, an upper edge of each of the electrode portions 122 is supported by the electrode supporting portion 130, and thus, even if the cut portion 121a is formed in the sheet member 121, the electrode portion 122 may be prevented from easily detaching from the test socket 100.

In addition, the electrode supporting portion 130 performs the function of guiding the terminal 11 of subject device 10 to be located at a center of the electrode portion 122 even when the terminal 11 of the subject device 10 is not disposed at the center of the electrode portion 122 but is deviated to the left or right. For example, the electrode supporting portion 130 also performs the function of guiding the terminal 11 of the subject device 10 to the center of the electrode portion 122.

Figure 5:
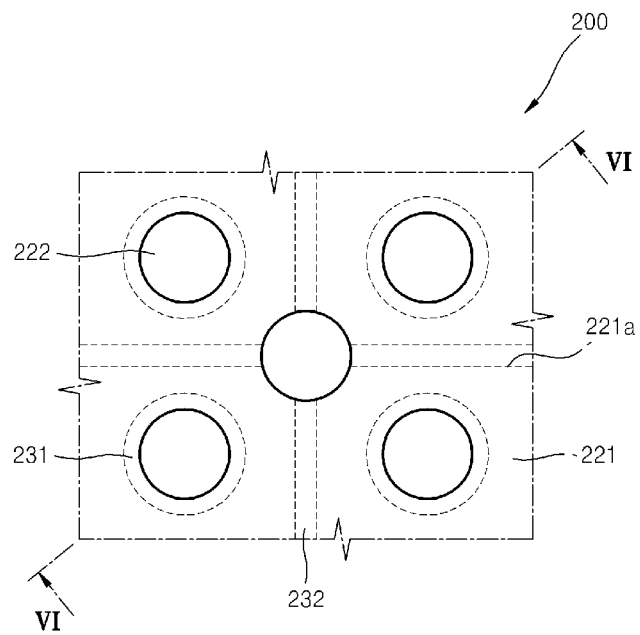
FIG. 5 is a plan view of a test socket according to another embodiment of the present invention.
Figure 6:
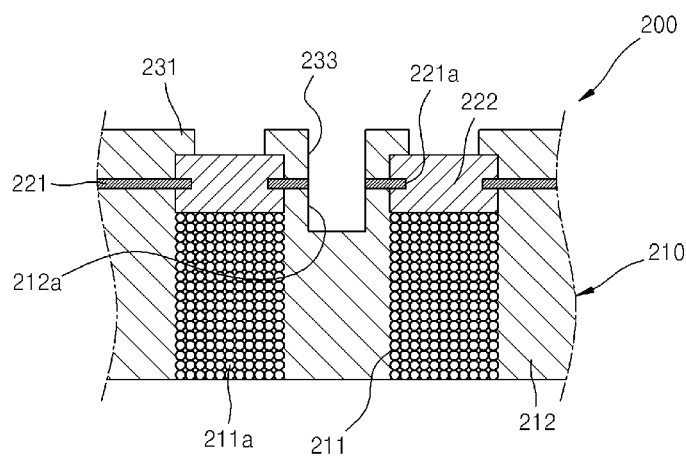
FIG. 6 is a cross-sectional view of the test socket of FIG. 5 cut along a line VI-VI according to an embodiment of the present invention.

The test socket 100 may be modified as follows as shown in FIGS. 5 and 6.

Figure 7A:
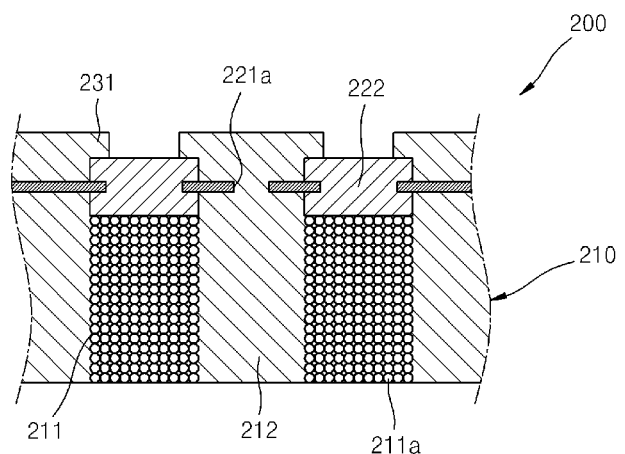
FIGS. 7A and 7B illustrate a method of manufacturing the test socket of FIG. 5 according to an embodiment of the present invention.
Figure 7B:
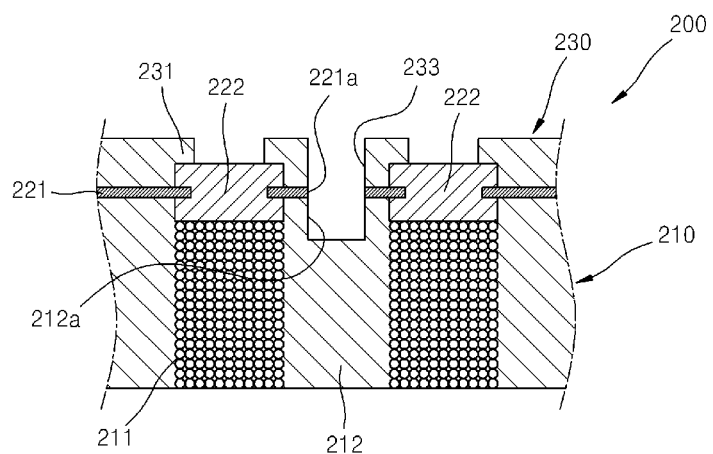

FIG. 5 is a plan view of a test socket 200 according to another embodiment of the present invention. FIG. 6 is a cross-sectional view of the test socket 200 of FIG. 5 cut along a line VI-VI according to an embodiment of the present invention. FIGS. 7A and 7B illustrate a method of manufacturing the test socket 200 of FIG. 5 according to an embodiment of the present invention.

First, referring to FIGS. 5 and 6, the test socket 200 includes, differently from the test socket 100 illustrated in FIGS. 1 and 2, a recess 233 that is formed in a portion of an electrode supporting portion 230 corresponding to a cut through hole 221a and through the cut through hole 221a. The recess 233 allows each electrode portion 222 to easily move independently. For example, the recess 233 minimizes movement of each electrode portion 222 in connection with the electrode supporting portion 230 so that each electrode portion 222 may independently move in the vertical direction as much as possible.

The test socket 200 illustrated in FIGS. 5 and 6 may be manufactured as illustrated in FIGS. 7A and 7B. The overall manufacturing method is similar to the method described with reference to FIGS. 4A through 4F. First, a test socket 200 having a shape corresponding to the shape of the test socket 100 illustrated in FIG. 4F is manufactured as illustrated in FIG. 7A. Then, as illustrated in FIG. 7B, a laser is used to additionally form the recess 233. That is, intensity of the laser is appropriately adjusted to additionally form the recess 233 in the electrode supporting portion 230.

Figure 8:
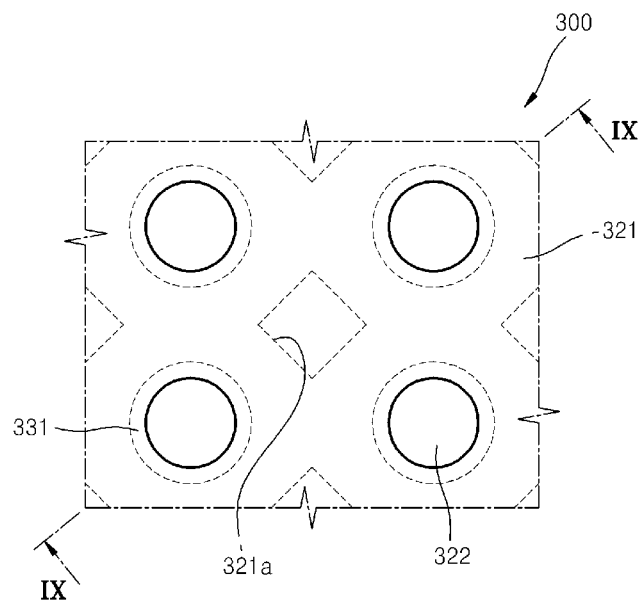
FIG. 8 is a plan view of a test socket according to another embodiment of the present invention.
Figure 9:
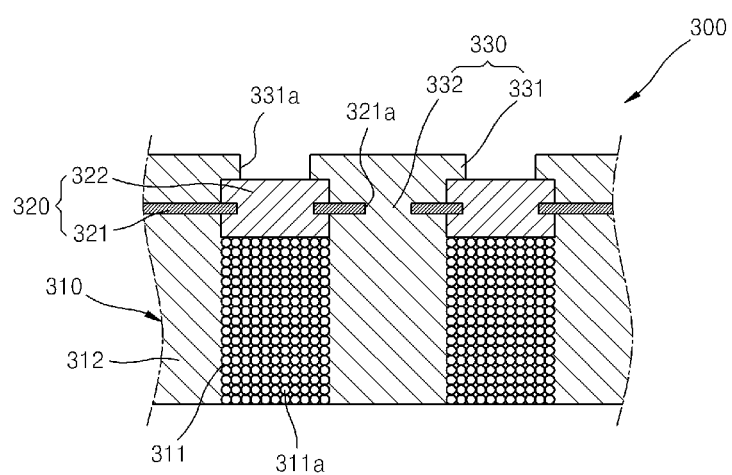
FIG. 9 is a cross-sectional view of the test socket of FIG. 8 cut along a line IX-IX according to an embodiment of the present invention.

FIG. 8 is a plan view of a test socket 300 according to another embodiment of the present invention. FIG. 9 is a cross-sectional view of the test socket 300 of FIG. 8 cut along a line IX-IX according to an embodiment of the present invention. FIGS. 10A through 10E illustrate a method of manufacturing the test socket 300 of FIG. 8 according to an embodiment of the present invention.

According to another embodiment of the present invention, the test socket 300 as illustrated in FIGS. 8 and 9 may also be implemented. Unlike the test socket 100 illustrated in FIGS. 1 and 4D, in the test socket 300, a cut portion 321a is formed in only a partial portion of space between electrode portions 322 and not around the entire circumference of each electrode portion 322. That is, a cut through hole 321a is formed in a portion between adjacent electrode portions 322. The cut through hole 321a is formed to pass through an upper surface and a lower surface of the sheet member 321. While the cut through hole 321a having a rectangular cross-section is illustrated in FIG. 8, the cut through hole 321a may have a circular shape or other various shapes.

The test socket 300 illustrated in FIGS. 8 and 9 is manufactured as illustrated in FIGS. 10A through 10E.

Figure 10A:
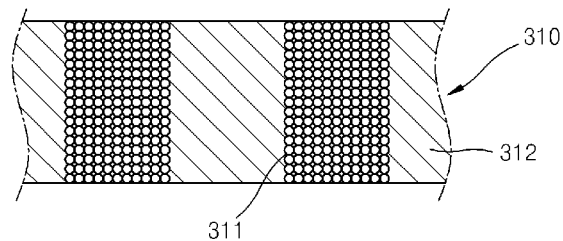
FIGS. 10A through 10E illustrate a method of manufacturing the test socket of FIG. 8 according to an embodiment of the present invention.

First, as illustrated in FIG. 10A, an elastic conductive sheet 310 including a conductive portion 311, in which a plurality of conductive particles are arranged so that conductivity may be exhibited in a thickness direction, at each position of a subject device corresponding to a terminal in an insulating material, and an insulating supporting portion 312 that supports and insulates the conductive portion 311 at the same time, is provided.

Figure 10B:
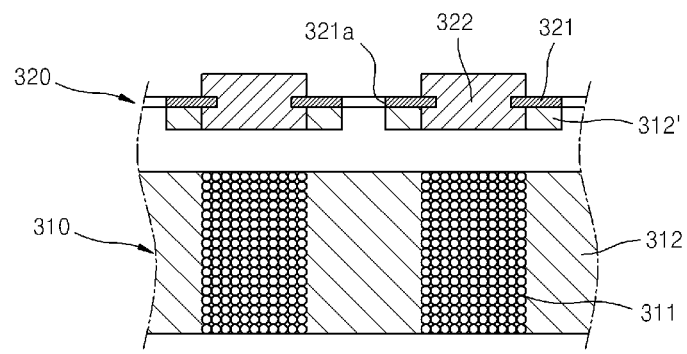

Then, as illustrated in FIG. 10B, a sheet type connector 320 including a sheet member 321 and an electrode portion 322 that is coupled to the sheet member 321 at each position corresponding to the conductive portion 311 is provided, and a cut portion 321a that cuts a portion of the sheet member 321 between electrode portions 322 is formed.

Figure 10C:
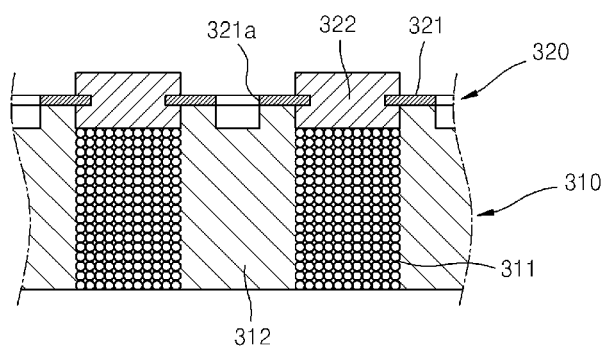
Figure 10D:
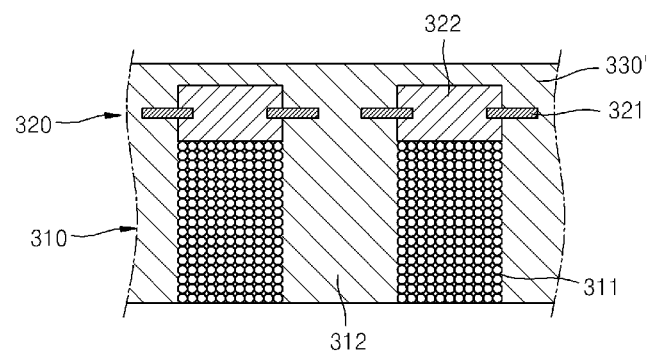
Figure 10E:
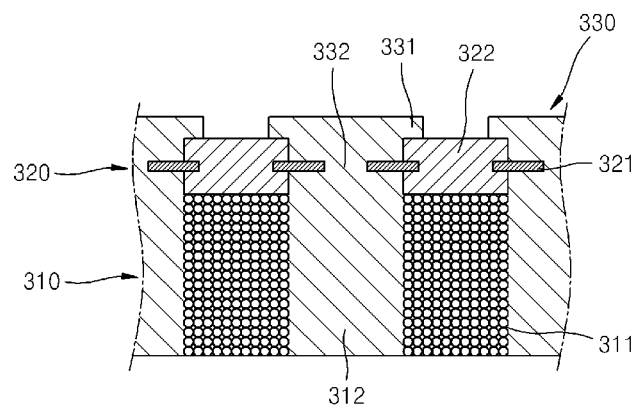

Then, as illustrated in FIG. 10C, the sheet type connector 320 is attached on the elastic conductive sheet 310. As illustrated in FIG. 10D, an insulating material 330' is applied on the sheet type connector 320 to cover the same. Then, as illustrated in FIG. 10E, an electrode supporting portion 330 is formed by removing a portion of the insulating material 330' disposed on a position corresponding to a center portion of the electrode portion 322 such that the center portion of the electrode portion 322 may be exposed to the outside.

In the test socket 300 described above, compared to the test socket 100 illustrated in FIGS. 1 and 2, the cut portion 321a does not completely separate the sheet member 321 coupled to each electrode portion 322 from the electrode portion 322, and thus, independent movement of the electrode portion 322 may not be very easy, but overall, the electrode portion 322 may be firmly fixed to the elastic conductive sheet 310. In addition, a laser cutting operation for manufacturing the cut portion 321a is omitted after attaching the sheet type connector 320 on the elastic conductive sheet 310, thereby simplifying the overall manufacturing method.

Figure 11:
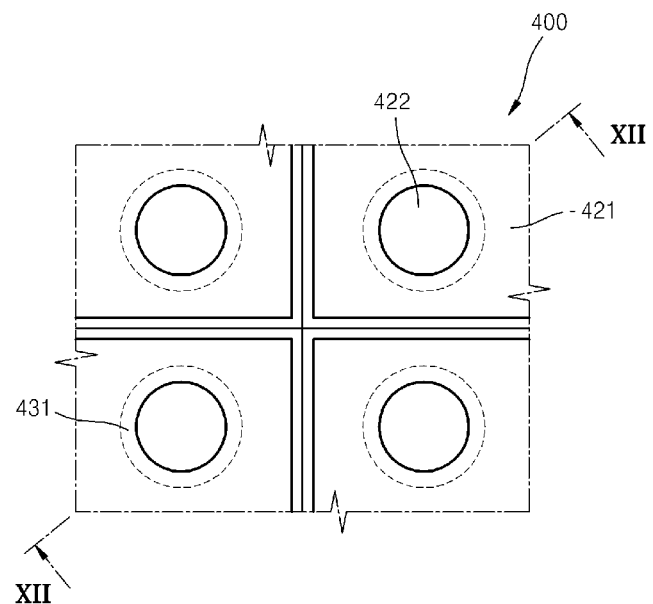
FIG. 11 is a plan view of a test socket according to another embodiment of the present invention.
Figure 12:
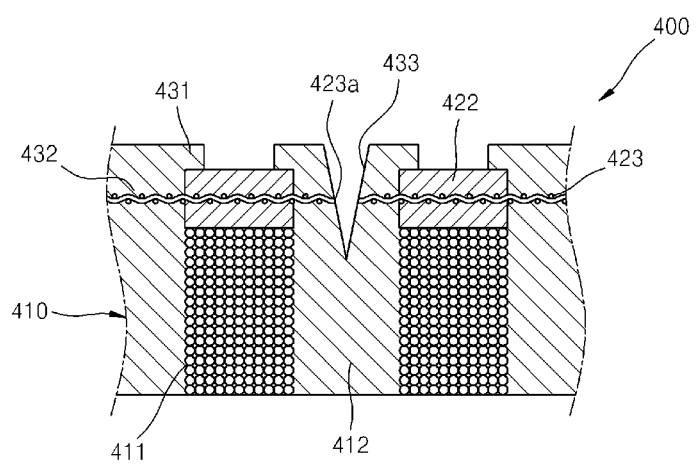
FIG. 12 is a cross-sectional view of the test socket of FIG. 11 cut along a line XII-XII according to an embodiment of the present invention.

A test socket 400 according to another embodiment of the present invention, as illustrated in FIGS. 11 and 12 may be formed.

FIG. 11 is a plan view of a test socket 400 according to another embodiment of the present invention. FIG. 12 is a cross-sectional view of the test socket 400 of FIG. 11 cut along a line XII-XII according to an embodiment of the present invention. FIGS. 13A through 13E illustrate a method of manufacturing the test socket 400 of FIG. 11 according to an embodiment of the present invention.

The test socket 400 illustrated in FIGS. 11 and 12 is different from the test socket 100 illustrated in FIGS. 1 and 2 in regard to the shape of an electrode portion 422 and the material of a sheet member 423. The sheet member 423 of the test socket 400 of FIGS. 11 and 12 is formed of a porous sheet such as a mesh or non-woven fabric having a plurality of openings; also, the electrode portion 422 is not inserted into holes of the sheet member 423 but instead fills the openings of the porous sheet 423 and protrudes from upper and lower surfaces of the sheet member 423 to be thereby integrally coupled to the sheet member 423.

The test socket 400 illustrated in FIGS. 11 and 12 may be manufactured as illustrated in FIGS. 13A through 13E.

Figure 13A:
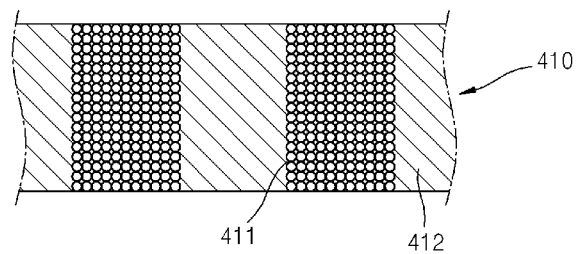
FIGS. 13A through 13E illustrate a method of manufacturing the test socket of FIG. 11 according to an embodiment of the present invention.

First, as illustrated in FIG. 13A, an elastic conductive sheet 410 including a conductive portion 411 in which a plurality of conductive particles are arranged in an insulating material so that conductivity may be exhibited in a thickness direction, at each position of a subject device corresponding to a terminal, and an insulating supporting portion 412 that supports and insulates the conductive portion 411 at the same time, is provided.

Figure 13B:
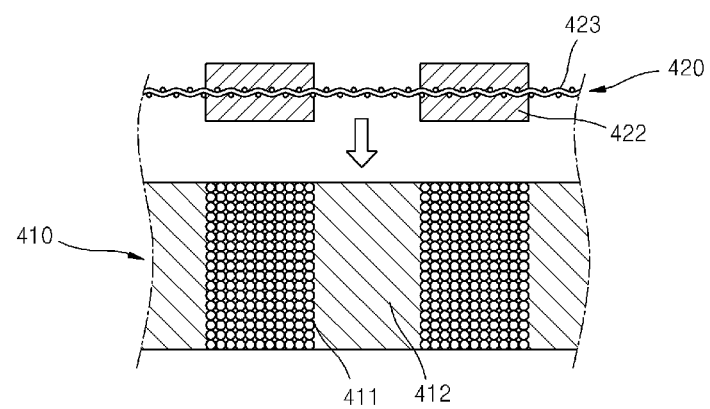
Figure 13C:
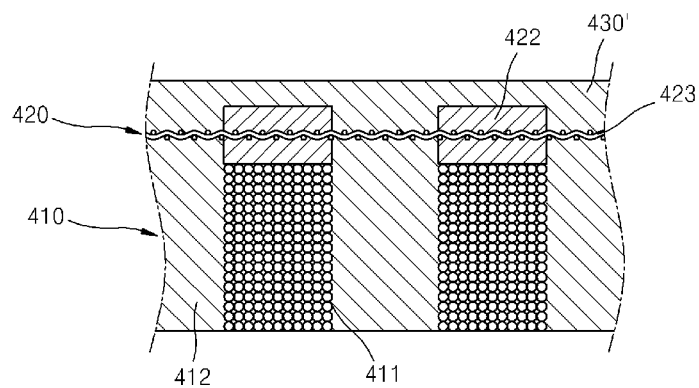
Figure 13D:
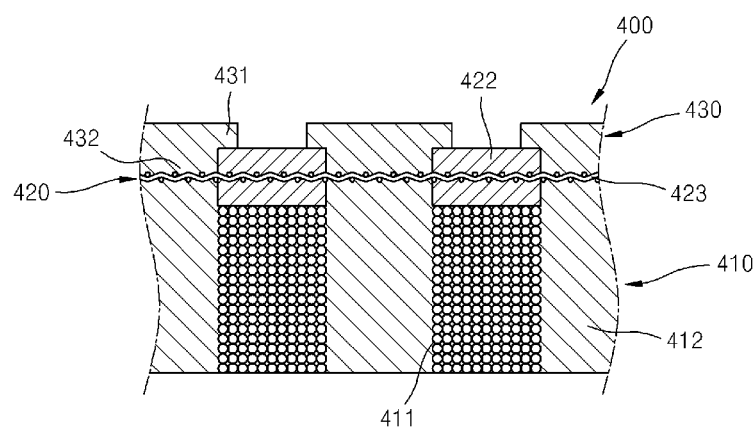
Figure 13E:
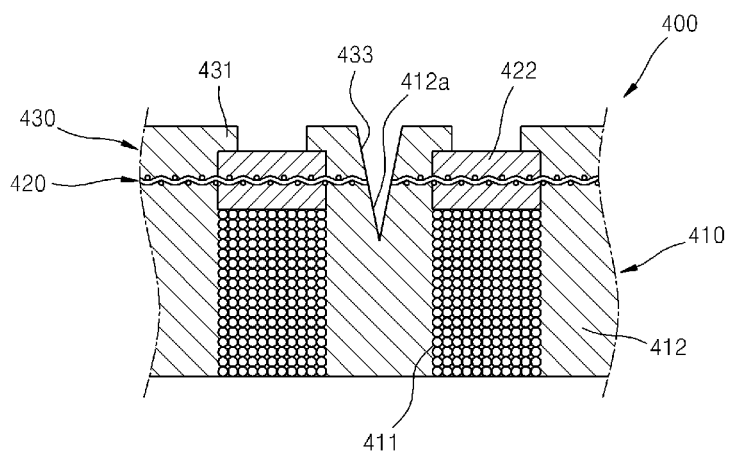

Then, as illustrated in FIG. 13B, a sheet type connector 420 including the porous sheet 423 and an electrode portion 422 that is coupled to the porous sheet 423 at each position corresponding to the conductive portion 411 is provided. Then, as illustrated in FIG. 13C, an insulating material 430' is applied on the sheet type connector 420 to cover the same. Then, as illustrated in FIG. 13D, an electrode supporting portion 430 is formed by removing the insulating material 430' disposed on a position corresponding to a center portion of the electrode portion 422 such that the center portion of the electrode portion 422 is exposed to the outside. Then, as illustrated in FIG. 13E, a cut portion 433 that cuts at least a portion of the porous sheet 423 between the electrode portions 422 is formed.

According to the test socket 400 illustrated in FIGS. 11 and 12, the sheet member 423 may be firmly fixed to the elastic conductive sheet 410. That is, the insulating material 430' is filled between openings of the sheet member formed of the porous sheet 423, and thus, the porous sheet 423 may be firmly fixed to the elastic conductive sheet 410, and moreover, the electrode portions 422 also fill the openings of the porous sheet 423 to be thereby firmly fixed to the porous sheet 423, and it is easy to manufacture the test socket 400 in this manner. In other words, without requiring a separate operation of forming an electrode, an electrode may be easily formed by plating the porous sheet 423, and thus, the overall manufacturing method is easy. In addition, the porous sheet 423 has excellent elasticity compared to typical sheets with respect to the same thickness, and thus, the electrode may have a sufficient displacement range.

Figure 14:
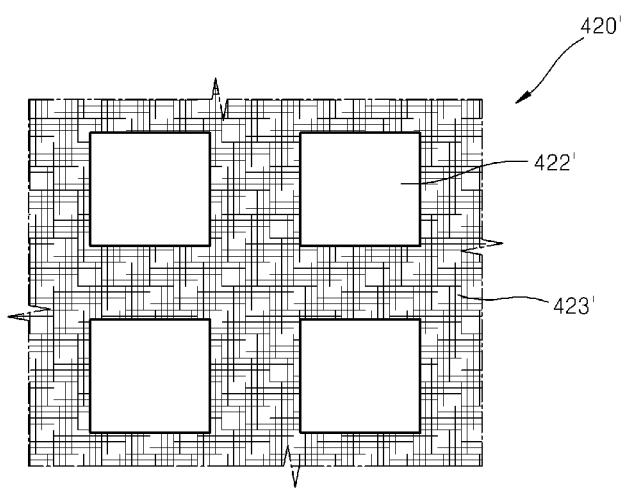
FIG. 14 illustrates a sheet-type connector, which is an element of the test socket of FIG. 11, according to another embodiment of the present invention.

FIG. 14 illustrates a sheet-type connector 420', which is an element of the test socket of FIG. 11 according to another embodiment of the present invention.

While the electrode portion 422 according to the above embodiment of the present invention has a circular cross-section, the embodiments of the present invention are not limited thereto; a sheet type connector 420' may also be formed of a porous sheet 423' and an electrode 422' having a polygonal cross-section as illustrated in FIG. 14.

In addition, while the sheet type connector 420 is disposed on the elastic conductive sheet 410, the embodiments of the present invention are not limited thereto; the sheet type connector 420 may be disposed under the electric conductive sheet 410 or both on and under the elastic conductive sheet 410. Also, the electrode supporting portion 430 may be formed under the electric conductive sheet 410 or both on and under the elastic conductive sheet 410.

According to the test socket of the embodiments of the present invention, a cut portion is formed in a sheet member supporting an electrode portion, so as to provide not only a maximum vertical displacement amount of each electrode portion but also minimize detachment of the electrode portion from the test socket as each electrode is supported via an electrode supporting portion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A test socket including an electrode supporting portion, which is disposed between a terminal of a subject device and a pad of an inspection device to electrically connect the terminal and the pad, the test socket comprising:

an elastic conductive sheet including a conductive portion, in which a plurality of conductive particles are arranged in an insulating material so that conductivity is exhibited in a thickness direction, at each position of the subject device corresponding to the terminal, and an insulating supporting portion that supports and insulates the conductive portion at a same time;

a sheet type connector including an electrode portion that is disposed on the conductive portion and is formed of a metal, and a sheet member that supports the electrode portion, wherein the sheet member comprises a cut portion formed by cutting at least a portion of the sheet member between adjacent electrode portions; and the electrode supporting portion including an upper supporting portion that integrally attached to an upper edge of the electrode portion to support the electrode portion and exposes an upper center portion of the electrode portion to be open and the electrode supporting portion including a connection supporting portion that connects the upper supporting portion and the insulating supporting portion; and wherein the upper supporting portion is disposed on upper side of the electrode portion and upper side of the sheet member.

2. The test socket of claim 1, wherein the cut portion is a cutting opening formed around an entire circumference of the electrode portion.

3. The test socket of claim 1, wherein the sheet member is a film formed of a synthetic resin material.

* * * * *